United States Patent
Lim et al.

(10) Patent No.: US 8,174,896 B2
(45) Date of Patent: May 8, 2012

(54) NONVOLATILE MEMORY DEVICE AND METHOD OF OPERATING THE SAME

(75) Inventors: Kyu Hee Lim, Seoul (KR); Seong Je Park, Gyeonggi-do (KR); Jung Chul Han, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 312 days.

(21) Appl. No.: 12/647,593

(22) Filed: Dec. 28, 2009

(65) Prior Publication Data

US 2010/0195400 A1 Aug. 5, 2010

(30) Foreign Application Priority Data

Feb. 4, 2009 (KR) .................. 10-2009-0008792

(51) Int. Cl.
*G11C 16/04* (2006.01)
(52) U.S. Cl. ............ 365/185.19; 365/185.12; 365/185.2
(58) Field of Classification Search ............ 365/185.19, 365/185.17, 185.18, 185.12, 185.2, 185.22, 365/185.24, 185.03, 189.07
See application file for complete search history.

(56) References Cited

U.S. PATENT DOCUMENTS

| | | | | |
|---|---|---|---|---|
| 7,120,051 B2* | 10/2006 | Gorobets et al. | ......... | 365/185.02 |
| 7,230,852 B2* | 6/2007 | Mitani et al. | ............ | 365/185.18 |
| 7,301,805 B2* | 11/2007 | Gorobets et al. | ......... | 365/185.02 |
| 7,301,808 B2* | 11/2007 | Li et al. | .................... | 365/185.03 |
| 7,965,553 B2* | 6/2011 | Han | .......................... | 365/185.09 |
| 2010/0195394 A1* | 8/2010 | Park | .......................... | 365/185.16 |
| 2010/0329021 A1* | 12/2010 | Lee | ........................... | 365/185.19 |

FOREIGN PATENT DOCUMENTS

| KR | 1020080029749 | | 4/2008 |
|---|---|---|---|
| KR | 1020090118382 | A | 11/2009 |
| KR | 1020090118665 | A | 11/2009 |

OTHER PUBLICATIONS

Notice of Preliminary Rejection issued from Korean Intellectual Property Office on Feb. 24, 2011.

* cited by examiner

*Primary Examiner* — Gene Auduong
(74) *Attorney, Agent, or Firm* — IP & T Group LLP

(57) ABSTRACT

A nonvolatile memory device comprises a page buffer unit, a counter, a program pulse application number storage unit, and a program start voltage setting unit. The page buffer is configured to output a 1-bit pass signal when a cell programmed to exceed a reference voltage, from among target program cells included in a single page, exists. The counter is configured to count a number of program pulses applied to determine a program pulse application number. The program pulse application number storage unit is configured to store a number of program pulses applied until the 1-bit pass signal is received during a program operation for a first page. The program start voltage setting unit is configured to set a program start voltage for a second page based on the stored program pulse application number.

10 Claims, 14 Drawing Sheets

FIG. 1
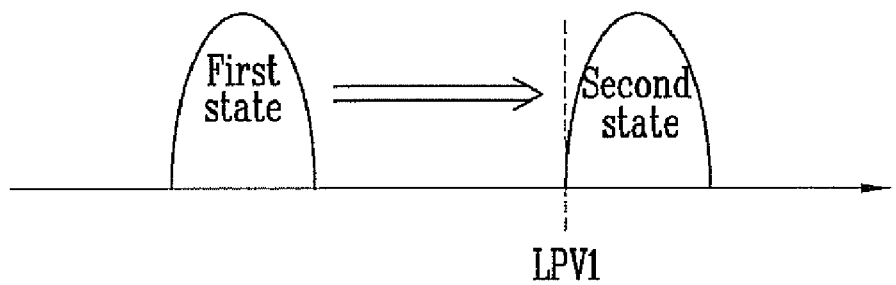
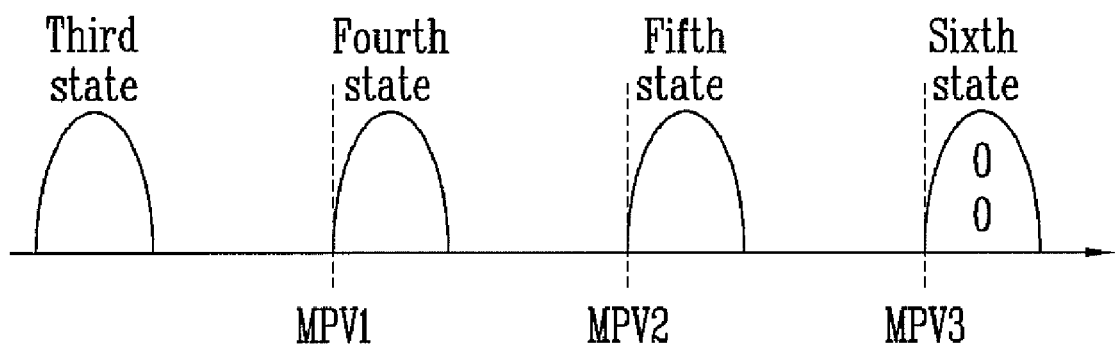

NONVOLATILE MEMORY DEVICE AND METHOD OF OPERATING THE SAME

CROSS-REFERENCE TO RELATED APPLICATION

Priority to Korean patent application number 10-2009-0008792 filed on Feb. 4, 2009, the entire disclosure of which is incorporated by reference herein, is claimed.

BACKGROUND

Embodiments relate to a nonvolatile memory device and a method of operating the same.

In recent years, there is an increasing demand for nonvolatile memory devices which can be electrically programmed and erased and which do not require the refresh function of rewriting data at specific intervals.

The nonvolatile memory device is configured to enable electrical program and erase operations and perform the program and erase operations through the threshold voltage of a cell which varies when electrons are moved by a strong electric field applied to a thin oxide layer. During the programming operation of the nonvolatile memory device, a verification operation for determining whether a cell to be programmed has been programmed to exceed a reference voltage is performed. In the single level cell (SLC) program method, the verification voltage is only one, whereas in the multi-level cell (MLC) program method, the verification voltage is plural because cells of several states exist in a single page. For example, in the case where the most significant bit (MSB) program operation is performed in a 2-bit MLC program method, a verification operation is performed based on three verification voltages.

According to the incremental step pulse program (ISPP) method, after a pulse is applied once, three verification operations need to be performed. There is known a blind verification method of performing only some of verification operations (not all the verification operations) with the program speed taken into consideration. If the number of program/erase cycles of a nonvolatile memory device increases, there is a tendency that the program speed increases. Accordingly, there is a need for a program method with consideration taken of such a tendency.

BRIEF SUMMARY

One or more embodiments relate to a program method which is capable of minimizing the time taken for verification operations to be executed, which belongs to the program time of a nonvolatile memory device. One or more embodiments relate to a page buffer and a nonvolatile memory device with an improved structure to perform the optimized program method.

A nonvolatile memory device according to an embodiment comprises a page buffer unit, a counter, a program pulse application number storage unit, and a program start voltage setting unit. The page buffer is configured to output a 1-bit pass signal when a cell programmed to exceed a reference voltage, from among target program cells included in a single page, exists. The counter is configured to count the number of program pulses applied to determine a program pulse application number. The program pulse application number storage unit is configured to store the number of program pulses applied until the 1-bit pass signal is received during the program operation for a first page. The program start voltage setting unit is configured to set a program start voltage for a second page based on the stored program pulse application number.

A method of operating a nonvolatile memory device according to another embodiment comprises performing a program operation on a first page, counting a program pulse application number and repeatedly performing the program operation and a verification operation until a cell programmed to exceed a verification voltage is detected, performing program and verification operations using a blind verification method to thereby complete the program operation for the first page when a cell programmed to exceed the verification voltage is detected, setting a program start voltage for a second page based on a program pulse application number counted until a cell programmed to exceed the verification voltage is detected, and performing a program operation for the second page based on the set program start voltage.

BRIEF DESCRIPTION OF THE DRAWINGS

FIG. 1 is a diagram illustrating an MLC program method of a nonvolatile memory device;

DESCRIPTION OF EMBODIMENTS

Figure 2:
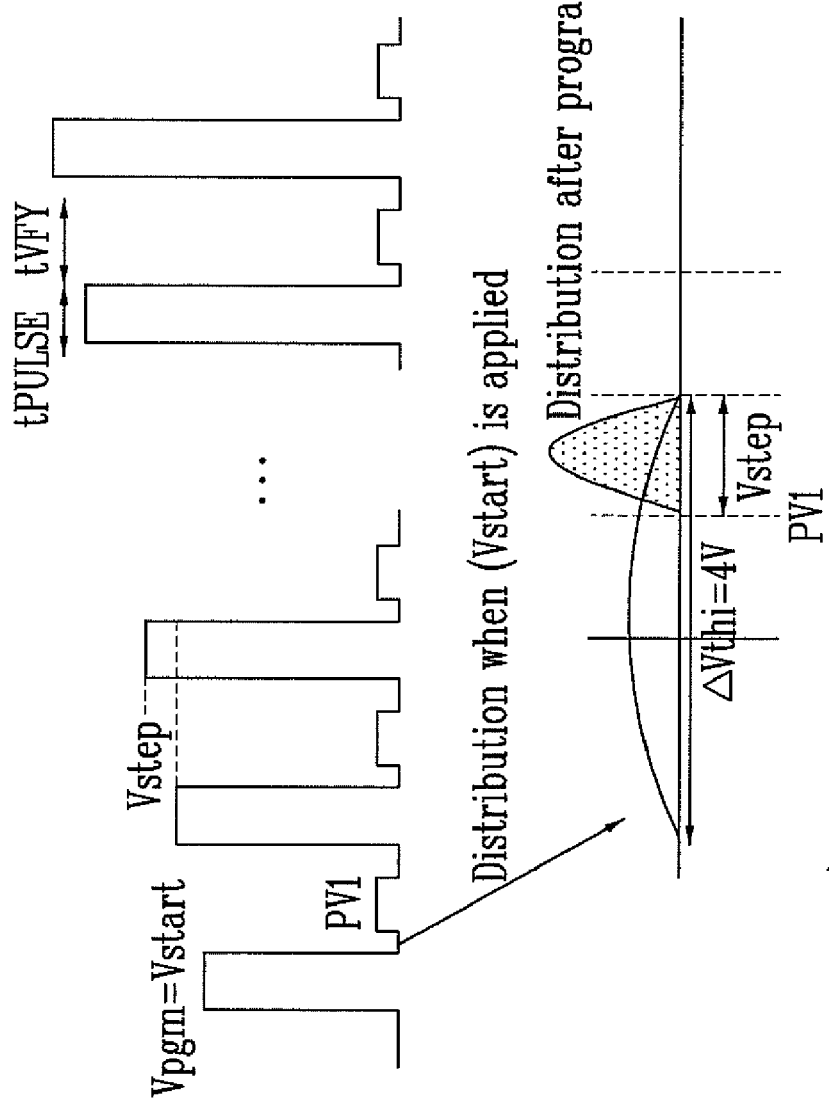
FIG. 2 is a diagram illustrating the concept of an ISPP method of a nonvolatile memory device.

Hereinafter, one or more embodiments of the present disclosure will be described in detail with reference to the accompanying drawings. The drawing figures are provided to allow those having ordinary skill in the art to understand the scope of the embodiments of the disclosure.

FIG. 1 is a diagram illustrating an MLC program method of a nonvolatile memory device.

In the least significant bit (LSB) program operation, two different cell distributions are generated by a program operation. That is, the distribution of cells programmed to have a verification voltage LPV1 or more is called a second state, and the distribution of cells programmed not to have the verification voltage LPV1 or more is called a first state.

In the state in which the LSB program operation has been performed, the most significant bit (MSB) program operation is performed. Four cell distributions (third to sixth states) with different threshold voltages are generated by the MSB program operation. Here, verification voltages differ according to the distributions. The verification voltages may include, for example, in order from lower voltage to higher voltage, a first verification voltage MPV1, a second verification voltage MPV2, and a third verification voltage MPV3. That is, a state in which cells are programmed to exceed the third verification voltage MPV3 is defined as the sixth state, a state in which cells are programmed to be less than the third verification voltage MPV3, but to exceed the second verification voltage MPV2 is defined as the fifth state, a state in which cells are programmed to be less than the second verification voltage MPV2, but to exceed the first verification voltage MPV1 is defined as the fourth state, and a state in which cells are programmed to be less than the first verification voltage MPV1 is defined as the third state. Furthermore, cells which will be programmed to have the fourth state are defined as first target verification cells, cells which will be programmed to have the fifth state are defined as second target verification cells, and cells which will be programmed to have the sixth state are defined as third target verification cells.

As described above, in the MSB program operation, verification operations have to be performed based on more verification voltages than the LSB program operation.

FIG. 2 is a diagram illustrating the concept of an ISPP method of a nonvolatile memory device.

In accordance with the ISPP method, a program pulse is repeatedly applied. Whenever the program pulse is applied, a verification operation is performed, and the program pulse is increased by a step voltage (Vstep).

As shown in FIG. 2, first, a program start voltage (Vstart) is applied. When a next program pulse is applied, the program pulse is increased by the step voltage (Vstep). Furthermore, whenever the program pulse is applied, a verification operation is performed. Accordingly, the time that it takes to apply the program pulse once is equal to the sum of a program pulse application time tPULSE and a verification time tVFY.

Meanwhile, in the case where the program start voltage (Vstart) is first applied to cells of an erase state, a distribution of the cells is called a unique distribution (ΔVthi). In FIG. 2, the unique distribution is illustrated to be approximately 4V. When a program operation is performed based on the program start voltage (Vstart), the step voltage (Vstep), and a first verification voltage PV1, a distribution of cells having threshold voltages which are more than the first verification voltage PV1, but less than a maximum value of the unique distribution (ΔVthi) is formed. The distribution of the programmed cells is equal to the amount of the step voltage (Vstep).

Theoretically, a program pulse application number (Npgm) (or the number of program pulses that are applied) required to complete a program operation is determined by the ratio of the unique distribution (ΔVthi) and the step voltage (Vstep). For example, assuming that the unique distribution (ΔVthi) is 4V and the step voltage (Vstep) is 1V, a total of four pulses have to be applied.

The time (tPROG) that it takes to perform the entire program operation is equal to the product of the program pulse application number (Npgm) and the time (tPULSE+tVFY) that it takes to apply a single program pulse.

In accordance with such an ISPP characteristic, the program pulse application number (Npgm) decreases with the step voltage (Vstep) increasing. Thus, the time (tPROG) that it takes to perform the entire program operation reduces. However, there is a problem in that the entire distribution is widened because the distribution of the programmed cells is equal to the step voltage (Vstep).

Figure 3:
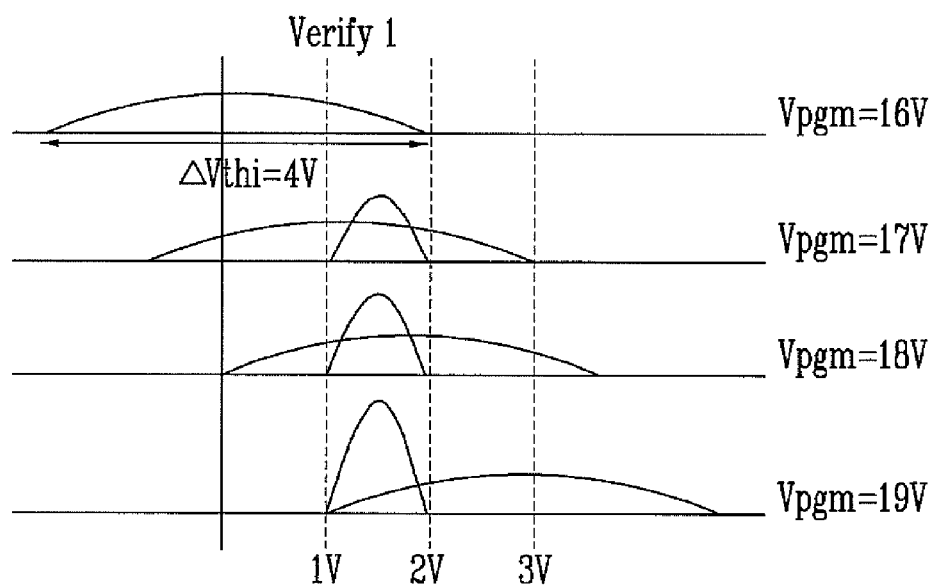
FIG. 3 is a diagram illustrating the movement of threshold voltages according to the application of program pulses in a ISPP method.

FIG. 3 is a diagram illustrating the movement of threshold voltages according to the application of program pulses in an ISPP method.

It is first assumed that a program start voltage (Vstart) is 16V, a step voltage (Vstep) is 1V, and a unique distribution (ΔVthi) is 4V. A target voltage for a program operation is 1V to 2V, and a verification voltage is 1V.

A program voltage (Vpgm) when a program pulse is first applied is 16V. When the first program pulse is applied, the threshold voltages of respective cells are determined according to the unique distribution (ΔVthi). In the case of cells programmed to exceed 1V after the first program pulse is applied, data stored in a corresponding page buffer is changed, and any program pulse is no longer applied.

When a second program pulse is applied, the threshold voltages of cells programmed to be less than 1V further rise because of the second program pulse. The threshold voltage of each of the cells programmed to be less than 1V preferably rises by 1V. It can be seen that the distribution of the cells when the first program pulse is applied has risen by about 1V. As described above, the threshold voltages of the cells programmed to exceed 1V when the first program pulse is applied are not changed because any program pulse is not applied.

In a similar way, when third and fourth program pulses are applied, the threshold voltages of the respective cells rise by 1V. A distribution of the threshold voltages of the programmed cells is equal to the amount of the step voltage (Vstep).

Figure 4:
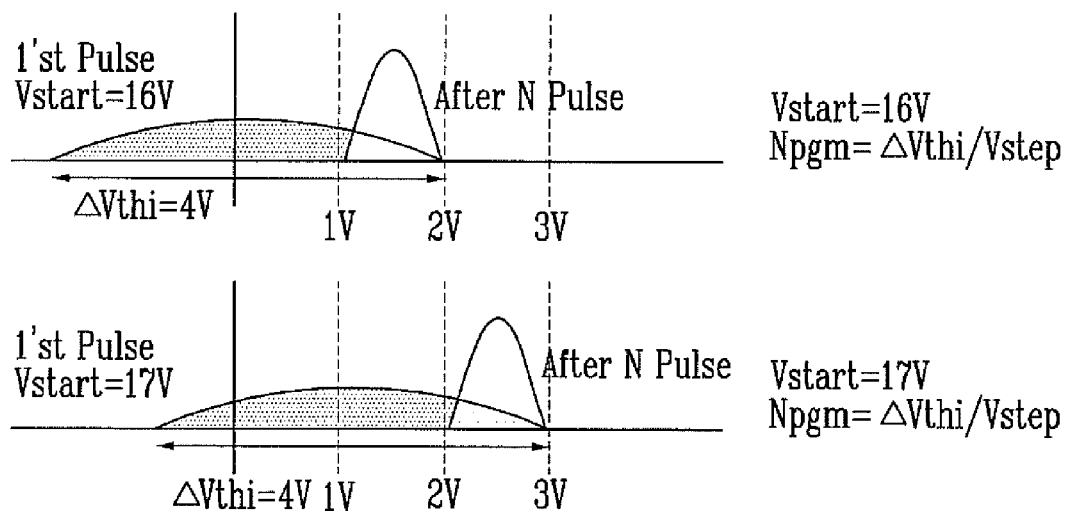
FIG. 4 is a diagram illustrating a change in the distributions according to the setting of a program start voltage in a ISPP method.

FIG. 4 is a diagram illustrating a change in the distribution according to the setting of a program start voltage in an ISPP method.

From FIG. 4, it can be seen that, in the case where a program start voltage (Vstart) is 16V and the case where a program start voltage (Vstart) is 17V (assuming that a unique distribution (ΔVthi) is 4V and a step voltage (Vstep) is 1V), distributions of the threshold voltages of cells after a program operation is completed differ in both cases. That is, if the program start voltage increases, the highest threshold voltage value further rises. The highest threshold voltage value is 2V when the program start voltage (Vstart) is 16V, and the highest threshold voltage value is 3V when the program start voltage (Vstart) is 17V. It can be seen that, when the program operation is completed, the highest threshold voltage values of both cases differ, but the distributions of the threshold voltages of the cells in the two cases are the same (i.e., 1V). This is because, as described above, a distribution of threshold voltages of cells is determined by the step voltage (Vstep).

As described above, the state in which a program operation is completed differs according to a change in the program start voltage (Vstart). In this case, the number of program pulses applied and the time that it takes to perform the program operation are the same in both cases. In view of such a characteristic, in the MLC program operation requiring several distributions of threshold voltages, a program operation must be performed based on one program start voltage. That is, in order to prevent an over-program problem, the program start voltage must be set on the basis of a cell having the lowest threshold voltage (i.e., a target voltage).

For example, in the case where a target threshold voltage is 1V to 2V, if the program start voltage (Vstart) is set to 17V, cells each programmed to have the threshold voltage of 2V to 3V are detected through the application of a single program pulse. The cells are considered as being over-programmed. For this reason, a program operation is performed with the program start voltage (Vstart) being set to 16V.

Figure 5:
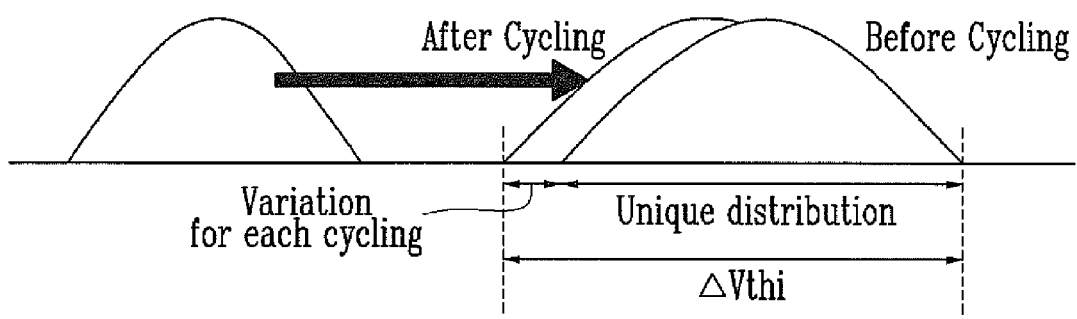
FIG. 5 is a diagram illustrating the concept of a change in the program speed of a nonvolatile memory device according to the number of program/erase cycles.

FIG. 5 is a diagram illustrating the concept of a change in the program speed of a nonvolatile memory device according to the number of program/erase cycles.

If a nonvolatile memory device is used, a program operation and an erase operation are performed several times. The program operation is performed on a page basis, and the erase operation is performed on a block basis. There is a tendency that the program speed of a nonvolatile memory device increases with an increase in the number of program/erase cycles. That is, the amount of electric charges trapped in the floating gate of the nonvolatile memory cell increase according to an increase in the number of program/erase cycles. Accordingly, the program speed becomes fast as compared with typical cells. In this case, the program speed may be defined as the amount of a change in the threshold voltage of a cell according to the application of a single program pulse.

Accordingly, the amount of a change in the threshold voltage according to an increase in the number of program/erase cycles must be taken into consideration by adding it to the unique distribution ($\Delta$Vthi) (i.e., a factor to determine the program pulse application number (Npgm) of the ISPP method). Here, the amount of a change in the threshold voltage increases according to an increased number of program/erase cycles.

If the program start voltage (Vstart) is set with such a characteristic taken into consideration, it has to be set low when compared with a case where the number of program/erase cycles is a minimum. That is, beginning with the first operation of a nonvolatile memory device, a low program start voltage is applied with consideration taken of the program speed according to an increased number of program/erase cycles. According to this construction, there is an effect in that dummy program pulses are substantially applied from the first operation of a nonvolatile memory device to a specific number of times of program/erase cycles. Accordingly, there is a problem because the time taken for program operations to be executed increases.

Figure 6:
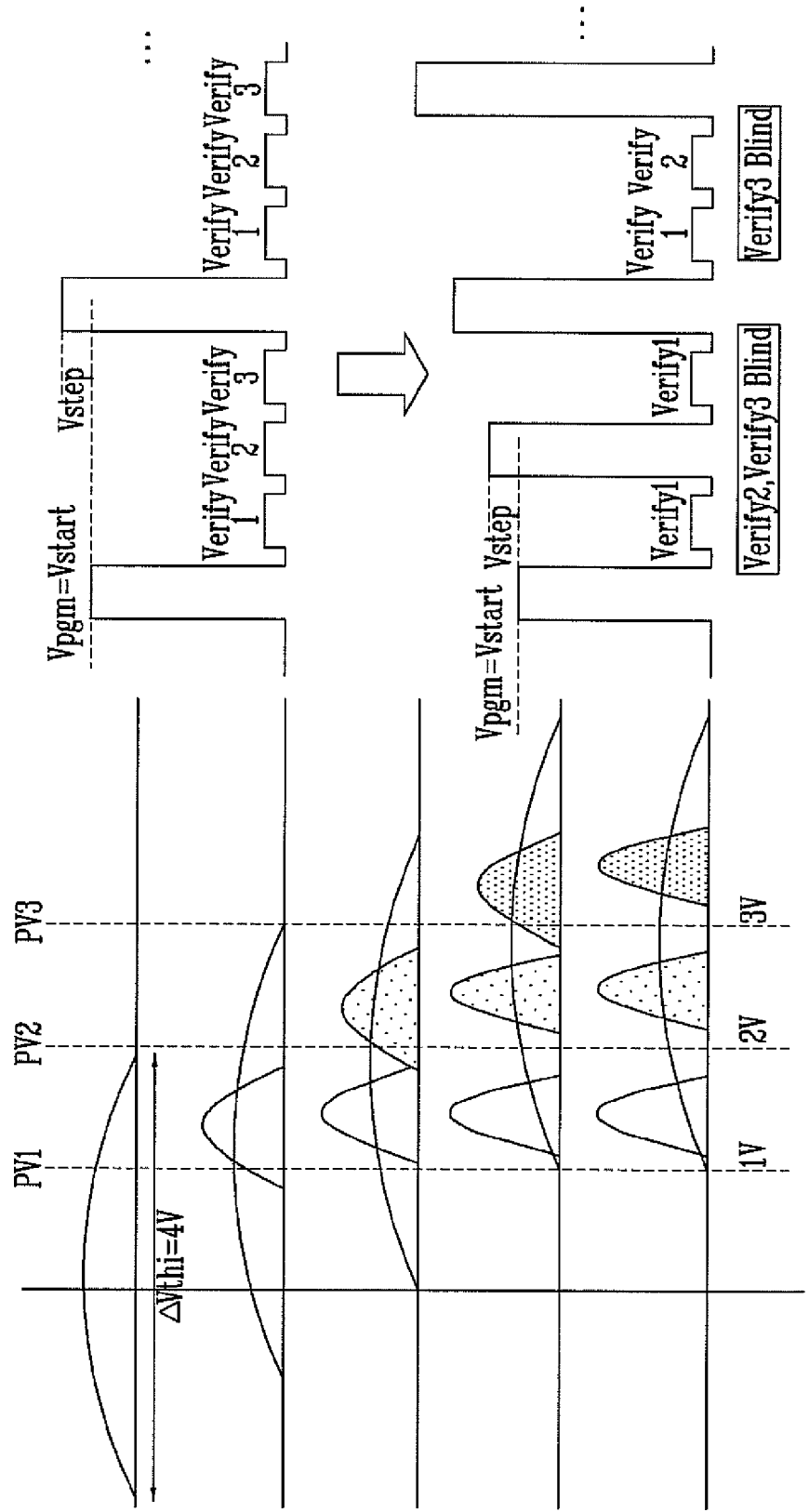
FIG. 6 is a diagram illustrating the concept of a blind verification method in the verification method of a nonvolatile memory device.

FIG. 6 is a diagram illustrating the concept of a blind verification method in the verification method of a nonvolatile memory device.

The verification method is applied to the MLC program method. The illustrated verification method is performed when a 2-bit MLC program method is performed. Verification operations based on three verification voltages PV1, PV2, and PV3 are performed. Since the verification operations are performed based on the three verification voltages, they should be in principle performed after a single program pulse is applied.

However, since the program start voltage is set based on the state in which the threshold voltage is the lowest as described above, cells programmed to exceed the second verification voltage PV2 or the third verification voltage PV3 are not detected when the first program pulse is applied. That is, after some program pulses are applied, cells programmed to exceed the second verification voltage PV2 or the third verification voltage PV3 are detected. Accordingly, in order to reduce the time that it takes to perform the verification operations, after the first program pulse is applied, only verification operations based on the first verification voltage are performed during the first several periods. This method is called the blind verification method because several verification operations are omitted as described above. Meanwhile, if a method of applying program pulses with consideration taken of a change in the program speed according to the number of program/erase verification cycles is used along with the blind verification method, the following problem occurs.

Figure 7:
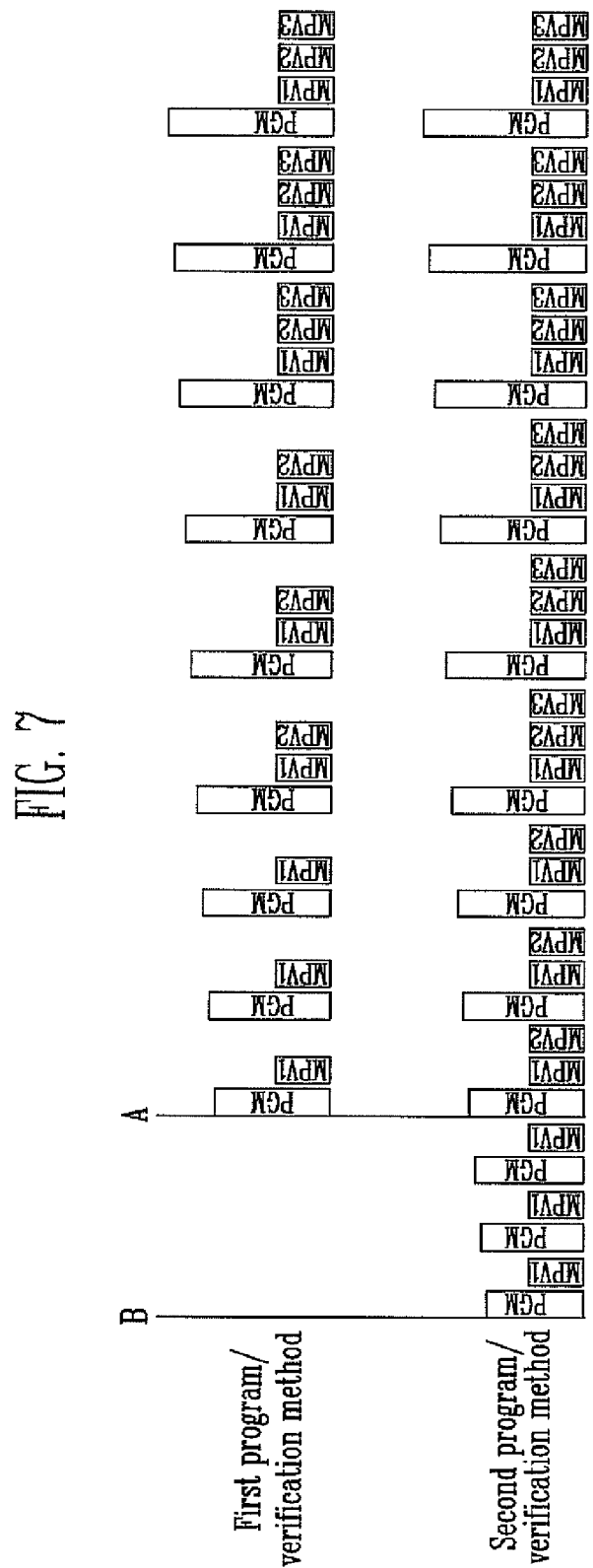
FIG. 7 is a diagram illustrating a program/verification method for an MSB program of a nonvolatile memory device.

FIG. 7 is a diagram illustrating a program/verification method for an MSB program of a nonvolatile memory device.

In a first program/verification method, after a first program voltage is applied, only verification operations based on a first verification voltage MPV1 are performed in accordance with the blind verification method. Although verification operations based on a second verification voltage MPV2 and a third verification voltage MPV3 have to be performed in principle, only the verification operations based on the first verification voltage MPV1 are performed in accordance with the blind verification method.

After a program pulse is applied and only about three verification operations based on the first verification voltage are performed, verification operations based on the first verification voltage and the second verification voltage are performed. After about three verification operations based on the first and second verification voltages are performed, verification operations based on the third verification voltage, as well as, the first and second verification voltages are performed. Meanwhile, the number of verification operations based on only the first verification voltage and the number of verification operations based on only the first and second verification voltages may be previously set.

A second program/verification method is described below. In the second program/verification method, a lowered program start pulse is applied in order to compensate for a tendency that the program speed increases according to an increase in the number of program/erase cycles. That is, as shown in FIG. 7, the program start pulse which is low as compared with the first program/verification method is applied. However, this method may be problematic according to the number of program/erase cycles.

In other words, since the program speed is fast when the number of program/erase cycles is great, the amount of a change in the threshold voltage is great although the low program pulse is applied. Therefore, it is necessary to perform verification operations although a low program voltage is applied. Further, after a point of time (A) at which the threshold voltage has risen to a certain extent, there is a need to perform verification operations based on the first and second verification voltages.

However, since the program speed is slow when the number of program/erase cycles is small, the amount of a change in the threshold voltage is small although a low program pulse is applied. Accordingly, when a low program voltage is applied, there is less need to perform verification operations. Moreover, since an increase in the threshold voltage is small, there is less need to perform verification operations based on the second verification voltage, as well as, the first verification voltage even after the point of time (A) at which program pulses have been applied several times.

Figure 8:
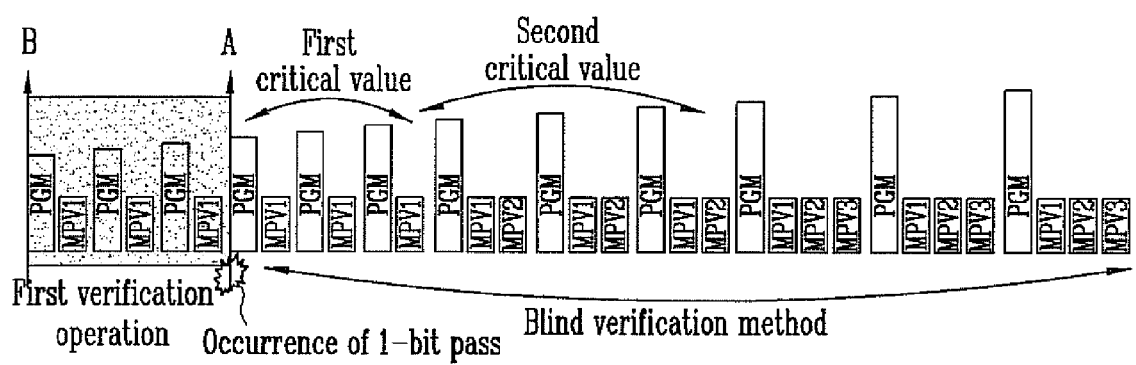
FIG. 8 is a diagram illustrating a program/verification method of a nonvolatile memory device according to an embodiment.

FIG. 8 is a diagram illustrating a program/verification method of a nonvolatile memory device according to an embodiment.

In the present disclosure, a first program start voltage is applied low with consideration taken of a tendency that the program speed rises according to an increase in the number of program/erase cycles. If the blind verification method is typically used in this state, in an initial operation in which the number of program/erase cycles is small, verification operations based on the second verification voltage may be unnecessarily performed along with verification operations based on the first verification voltage.

In the present disclosure, in order to prevent the problem, the blind verification method is performed on only cells programmed to exceed the first verification voltage.

That is, as shown in FIG. 8, before cells programmed to exceed the first verification voltage are detected, the first verification operation based on the first verification voltage and the ISPP operation are alternately executed. Immediately after cells programmed to exceed the first verification voltage are detected, the above-described blind verification method is performed.

Figure 9:
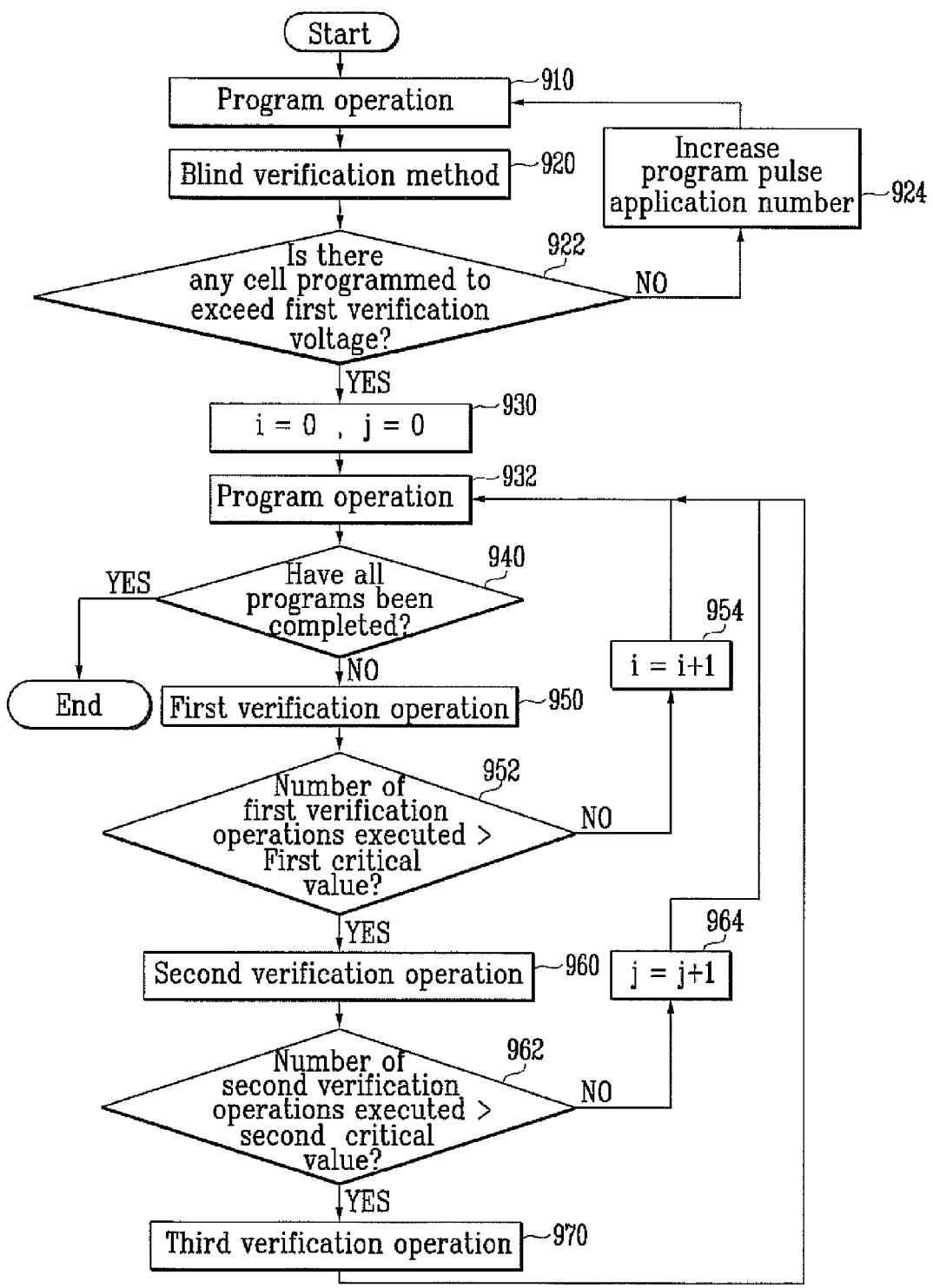
FIG. 9 is a flowchart illustrating a method of operating a nonvolatile memory device according to an embodiment.

FIG. 9 is a flowchart illustrating a method of operating a nonvolatile memory device according to an embodiment.

First, a program operation based on a program start voltage is performed at step 910. Here, the program start voltage is lower than a typical program start voltage. That is, a low set program start voltage is applied with consideration taken of a tendency that the program speed rises according to an increase in the number of program/erase cycles.

Next, a first verification operation to confirm whether first target verification cells have been programmed to exceed the first verification voltage is performed at step 920. As described above, the first target verification cells refer to cells which will be programmed to have the fourth state of FIG. 1 (i.e., cells programmed to be less than the second verification voltage MPV2, but to exceed the first verification voltage MPV1).

It is then determined whether, as a result of the first verification operation, cells programmed to exceed the first verification voltage exist at step 922. A verification operation according to the page buffer of a known nonvolatile memory device is described below. If specific cells are programmed to exceed the first verification voltage, the cells are turned on, and so the current path of a cell string including the corresponding cells is cut off. Thus, the voltage level of a bit line precharged to a logic high level remains intact, which is then transferred to the sense node. Since the voltage level of the sense node is a logic high-level state, data stored in the register is changed. If any one cell whose data has changed occurs in the entire page buffer, the cell is considered as being programmed to exceed the first verification voltage. A state in which one or more cells programmed to exceed the first verification voltage exist is called a 1-bit pass. In the present disclosure, a circuit for determining the 1-bit pass is further constructed. A detailed construction of the circuit is described below with reference to FIGS. 14 and 15.

Meanwhile, whether the blind verification method will be performed is determined according to a result of the determination at step 922. If, as a result of the determination at step 922, cells programmed to exceed the first verification voltage are determined to exist, the blind verification method starts. However, if, as a result of the determination at step 922, cells programmed to exceed the first verification voltage are determined not to exist, a program voltage is increased by the step voltage, and the program operation (step 910) and the first verification operation (step 920) are repeatedly performed. Furthermore, the number of program pulses applied is increased by '1' at step 924. The increased program pulse application number is applied to the embodiment of a program method which will be described below with reference to FIG. 12.

If, as a result of the determination at step 922, cells programmed to exceed the first verification voltage are determined to exist, a program voltage applied when an immediately-before program operation was performed is increased as much as the step voltage, and a program operation is repeatedly performed at step 932. Here, before the program operations are performed, a first verification operation execution number 'i' and a second verification operation execution number 'j' are reset to 0 at step 930.

It is then determined whether all verification operations have been completed at step 940. That is, it is determined whether all target verification cells have been programmed as desired through the first verification operation to a third verification operation. In a known nonvolatile memory device, after each verification operation is performed, a pass signal, informing that cells have been programmed to exceed a corresponding verification voltage based on data stored in the registers of a corresponding page buffer, or a fail signal, informing that there is a cell programmed not to exceed the verification voltage, is generated. Whether all the first to third verification operations have been completed is determined based on the pass or fail signal.

If all the verification operations are completed, it means that each target verification cell has been programmed to exceed a verification voltage. Thus, a program operation is no longer performed, and a corresponding program operation is completed. According to one or more embodiments, the number of program operations which are repeatedly performed may be limited to a specific number of times. In this case, if verification operations are not completed within the corresponding number of times, the characteristics of corresponding memory cells are considered a failure, and so a bad block processing operation is performed.

However, if, as a result of the determination at step 940, all verification operations are determined not to have been completed, first to third verification operations are sequentially performed.

First, only the program operation and the first verification operation are performed as much as a first critical value at steps 950, 952, 954, and 932. This method corresponds to the blind verification method. At the initial stage in which the number of program voltages applied is small, only the first verification operation is performed by the first critical value. After the first verification operation, it is determined whether the number of first verification operations executed exceeds the first critical value at step 952. If, as a result of the determination at step 952, the number of first verification operations executed is determined to be smaller than or equal to the first critical value, a program voltage is increased by the step voltage, and a program operation is repeatedly performed. In this case, the number of first verification operations executed is increased by '1' at step 954.

That is, as in FIG. 8, the program operation and the first verification operation are repeatedly performed by the first critical value. The first critical value may be optimally selected by an implementer according to the characteristic, etc, of a cell. The first critical value preferably is set to 3 (causing three repetitions). Meanwhile, during the first verification operation, a pass or a fail is checked based on data stored in the registers of the page buffer. The check result is used for the operation (step 940) to determine whether all verification operations have been completed after a next program operation is performed.

If the first verification operation is performed as much as the first critical value, the second verification operation to confirm whether second target verification cells have been programmed to exceed a second verification voltage is performed after the program operation and the first verification operation are performed at step 960.

Next, the first verification operation and the second verification operation are performed as much as a second critical value at steps 962 and 964. This method corresponds to the blind verification method. In more detail, after the second verification operation is performed at step 960, it is determined whether the number of second verification operations executed exceeds the second critical value at step 962. If, as a result of the determination at step 962, the number of second verification operations executed is determined to be smaller than or equal to the second critical value, a program voltage is increased by the step voltage, and the program operation is repeated. That is, as in FIG. 8, the program operation, the first verification operation, and the second verification operation are repeatedly performed as much as the second critical value. The second critical value may be optimally selected by an implementer according to the characteristic, etc. of a cell. The second critical value preferably is set to 3 (causing three repetitions).

Meanwhile, during the second verification operation, a pass or a fail is checked based on data stored in the registers of the page buffer. The check result is used for the operation (step 940) to determine whether all verification operations have been completed after a next program operation is performed.

Next, if the second verification operation is performed by the second critical value, after the program operation, the first verification operation, and the second verification operation are performed, the third verification operation to confirm whether third target verification cells have been programmed to exceed the third verification voltage is performed at step 970. During the third verification operation, a pass or a fail is checked based on data stored in the registers of a corresponding page buffer. The check result is used for the operation (step 940) to determine whether all verification operations have been completed after a next program operation is performed.

Since there is no need to further perform the blind verification method during the third verification operation, whether the number of third verification operations executed is greater than a critical value is not determined. After the third verification operation, the program voltage is increased by the step voltage, and the program operation is then performed at step 932. Next, whether the program operation will be repeated is determined according to whether or not the verification operations have been completed at step 940.

Meanwhile, according to some embodiments, the step of determining whether the number of third verification operations executed exceeds a specific critical value may be further added. If, as a result of the determination, the number of third verification operations executed is determined to exceed the specific critical value, corresponding cells may be subject to a bad block processing operation.

In summary, in performing the first to third verification operations, after a single program operation is performed, all the first to third verification operations are not performed, but are performed according to the blind verification method. In this case, a program start voltage is set low with consideration taken of the number of program/erase cycles. The blind verification method is executed from a point in time at which a cell programmed to exceed the first verification voltage is detected.

Figure 10:
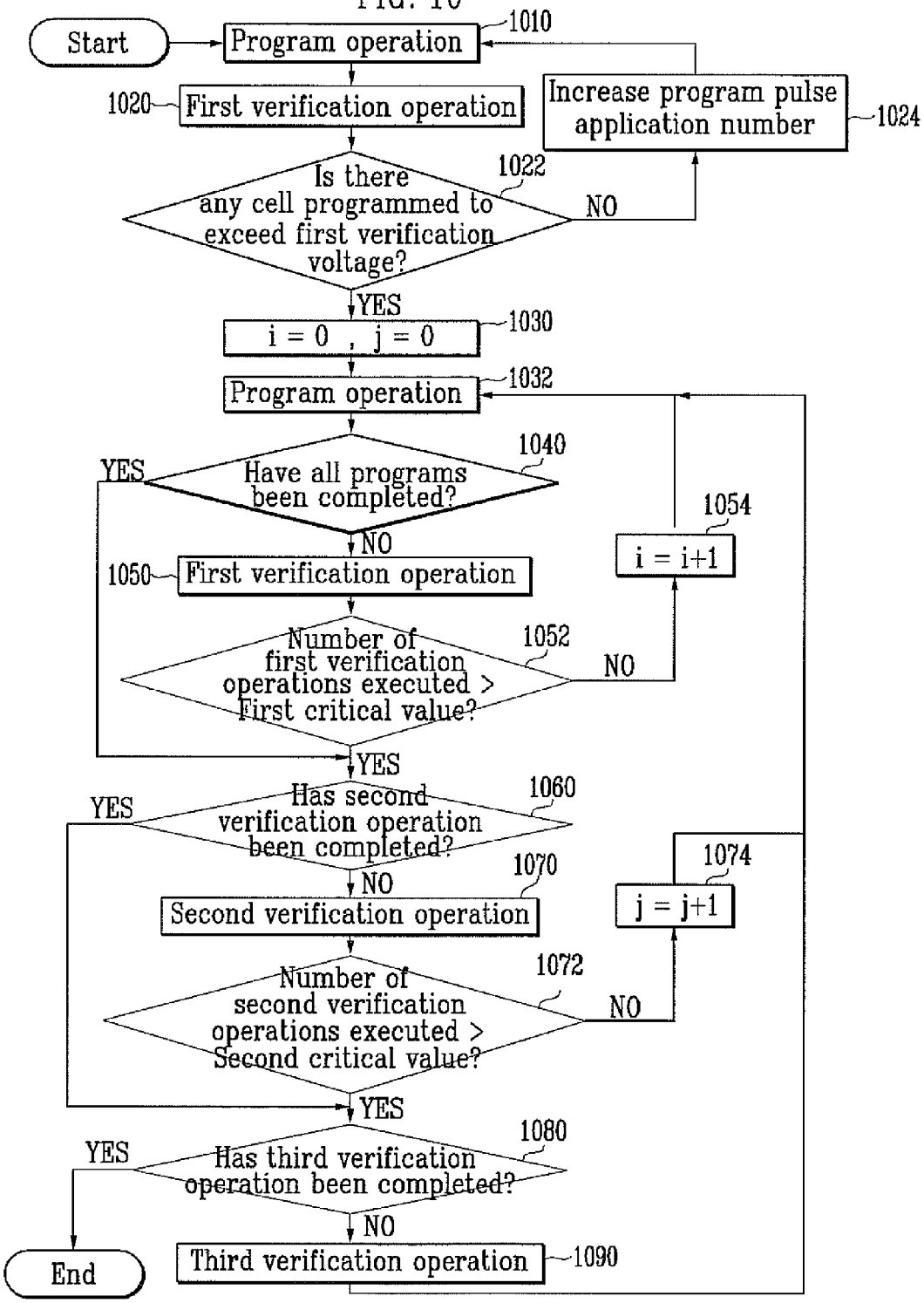
FIG. 10 is a flowchart illustrating a method of operating a nonvolatile memory device according to another embodiment.
Figure 11:
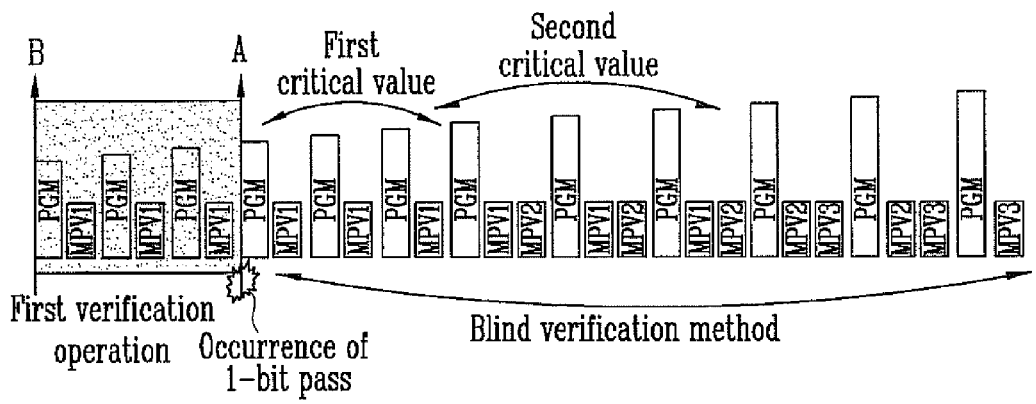
FIG. 11 is a diagram illustrating a program/verification method of a nonvolatile memory device according to yet another embodiment.

FIG. 10 is a flowchart illustrating a method of operating a nonvolatile memory device according to another embodiment, and FIG. 11 is a diagram illustrating a program/verification method of a nonvolatile memory device according to yet another embodiment.

The method shown in FIGS. 10 and 11 is almost the same as that of FIG. 9 except that, if a specific verification operation is completed during the first to third verification operations, the specific verification operation is not performed. That is, as shown in FIG. 11, if first target verification cells are all programmed to exceed the first verification voltage during a verification operation (i.e., the first verification operation is completed), the corresponding verification operation is not performed, and the remaining verification operations are performed.

Accordingly, an overall construction of FIGS. 10 and 11 is almost the same as that of FIG. 9 except that the step of determining whether each verification operation has been completed is further added before the verification operation is performed.

First, a program operation based on a program start voltage is performed at step 1010. The program start voltage is lower than a typical program start voltage. That is, a low set program start voltage is applied with consideration taken of a tendency that the program speed rises according to an increase in the number of program/erase cycles.

Next, a first verification operation to confirm whether first target verification cells have been programmed to exceed a first verification voltage is performed at step 1020.

It is then determined whether, as a result of the first verification operation, cells programmed to exceed the first verification voltage exist at step 1022. Here, whether the blind verification method will be performed is determined according to a result of the determination at step 1022. That is, if, as a result of the determination at step 1022, cells programmed to exceed the first verification voltage are determined to exist, the blind verification method starts. However, if, as a result of the determination at step 1022, cells programmed to exceed the first verification voltage are determined not to exist, the program voltage is increased by the step voltage, and the program operation (step 1010) and the first verification operation (step 1020) are repeatedly performed. Furthermore, the number of program pulses applied is increased by '1' at step 1024. The increased program pulse application number is applied to the embodiment of a program method which will be described with reference to FIG. 12.

If, as a result of the determination at step 1022, cells programmed to exceed the first verification voltage are determined to exist, a program voltage applied when an immediately-before program operation was performed is increased by the step voltage, and the program operation is repeatedly performed at step 1032. Before the program operation is performed, a first verification operation execution number 'i' and a second verification operation execution number 'j' are reset to 0 at step 1030.

It is then determined whether, before the first verification operation is performed, it has been completed by the immediately-before program operation at step 1040. While the first verification operations (steps 1020 and 1040) are performed during the immediately-before program operation, a pass or a fail is checked based on data stored in the registers of a corresponding page buffer. The check result is used to check whether the first verification operation has been completed.

If, as a result of the determination at step 1040, the first verification operation is determined to have been completed by the immediately-before program operation, the process goes to the step 1060 to determine whether a second verification operation has been completed. However, if, as a result of the determination at step 1040, the first verification operation is determined not to have been completed by the immediately-before program operation, the first verification operation is performed at step 1050.

The first verification operation is performed as much as a first critical value at step 1052, 1054, and 1032. This method corresponds to the blind verification method. A detailed operation of the blind verification method is the same as that shown in FIG. 9. In other words, after the first verification operation is performed, it is determined whether the number of first verification operations executed exceeds the first critical value at step 1052. If, as a result of the determination at step 1052, the number of first verification operations executed is determined to be smaller than or equal to the first critical value, the program voltage is increased as much as the step voltage, and the program operation is then repeatedly performed. That is, as shown in FIG. 11, the program operation and the first verification operation are repeatedly performed by the first critical value. The first critical value may be optimally selected by an implementer according to the characteristic, etc. of a cell.

Meanwhile, during the first verification operation, a pass or a fail is checked based on data stored in the registers of a corresponding page buffer. The check result is used for the operation (step 1040) to determine whether the first verification operation has been completed after a next program operation is performed.

If the first verification operation has been performed by the first critical value or the first verification operation has been completed, it is determined whether, before a second verification operation is performed, it has been completed by an immediately-before program operation at step 1060. While the second verification operation is performed (step 1072) during the immediately-before program operation, a pass or a fail is checked based on data stored in the registers of the page buffer. The check result is used to determine whether the second verification operation has been completed.

Since there is no need to further perform the blind verification method during a third verification operation, it is not determined whether the number of third verification operations executed is greater than a critical value. After the third verification operation, the program voltage is increased by the step voltage and the program operation is then performed at step 1032. Next, whether the program operation will be repeated is determined according to whether the third verification operation has been completed at step 1080.

Meanwhile, according to some embodiments, the step of determining whether the number of third verification operations executed exceeds a specific critical value may be further added. If, as a result of the determination, the number of third verification operation executed is determined to exceed the specific critical value, corresponding cells may be subject to a bad block processing operation.

In summary, in performing the first to third verification operations, after a single program operation is performed, all the first to third verification operations are not performed, but are performed according to the blind verification method. In this case, a program start voltage is set low with the number of program/erase cycles taken into consideration. The blind verification method is performed beginning at a point in time at which a cell programmed to exceed the first verification voltage is detected. Furthermore, when a next program operation is performed after each verification operation is completed, the corresponding verification operation may not be performed.

Figure 12:
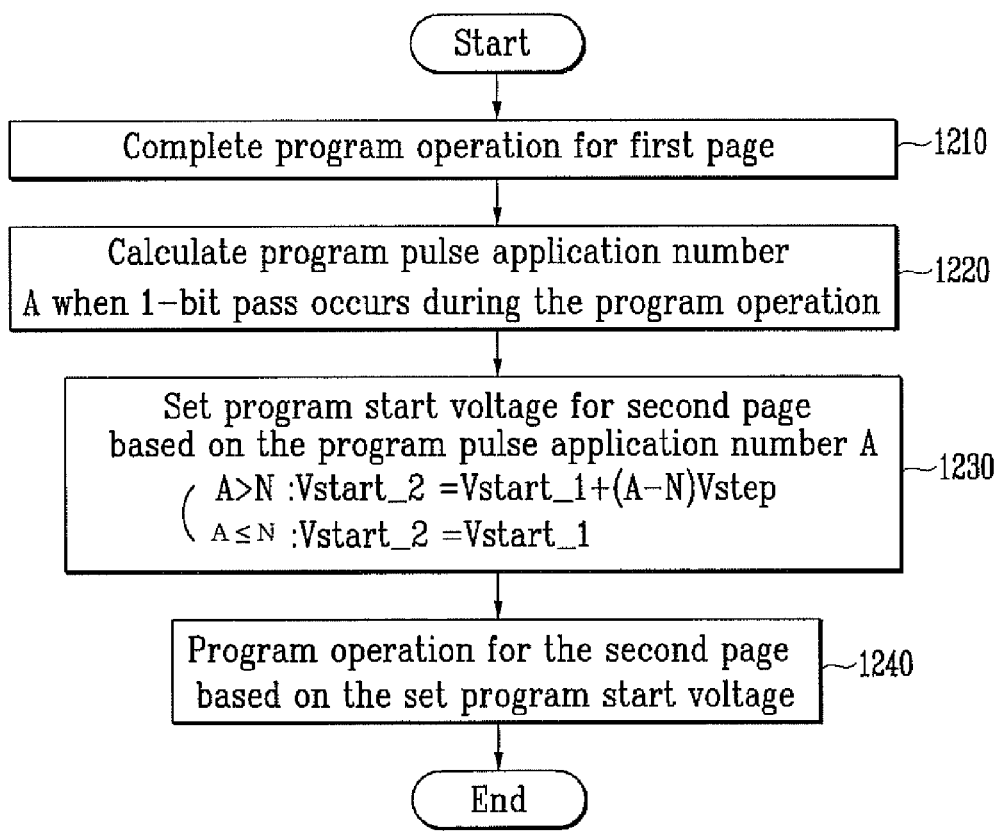
FIG. 12 is a flowchart illustrating a program method of a nonvolatile memory device according to yet another embodiment.
Figure 13:
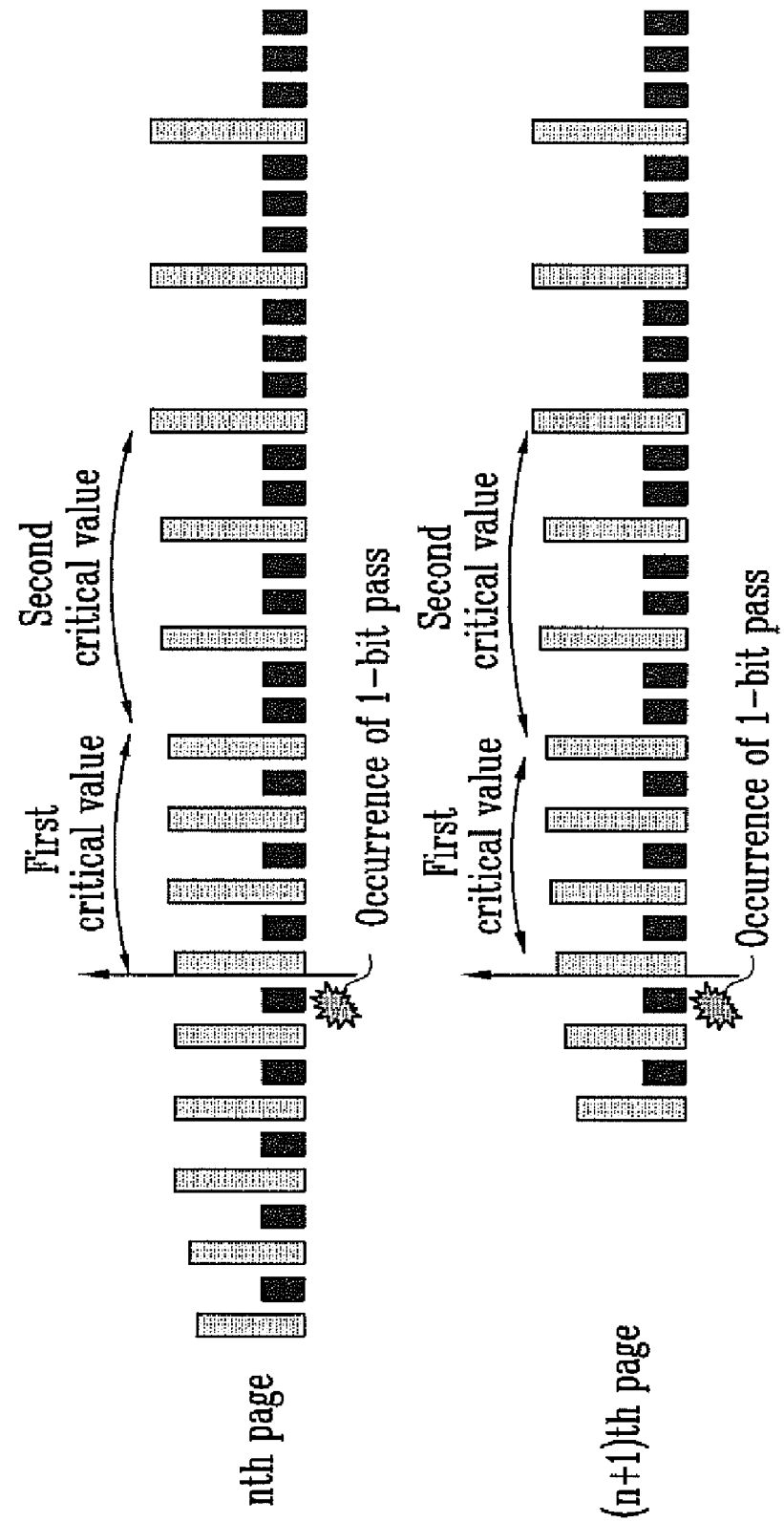
FIG. 13 is a diagram illustrating the concept of a method of operating a nonvolatile memory device according to yet another embodiment.

FIG. 12 is a flowchart illustrating a method of operating a nonvolatile memory device according to yet another embodiment, and FIG. 13 is a diagram illustrating the concept of the method of operating a nonvolatile memory device according to yet another embodiment.

In the present embodiment shown in FIG. 12, the program method according to the embodiment of FIG. 9 or FIG. 10 is used, but it includes a characteristic construction in setting a program start voltage according to each page.

First, a program operation for a first page is completed at step 1210.

The program operation for the first page is completed using the program method of FIG. 9 or FIG. 10. That is, as described above, the program operation is completed by the blind verification method based on a point in time at which the 1-bit pass occurs.

During the program operation, the number of program pulses applied A (or a program pulse application number A) until cells programmed to exceed the first verification voltage exist is calculated at step 1220. That is, the program pulse application number A is calculated until the 1-bit pass occurs. From FIG. 13, it can be seen that, during the program operation for the first page, a total of five program pulses have been applied until the 1-bit pass occurs. The program pulse application number A can be calculated according to the step 924 of the program method shown in FIG. 9 or the step 1024 of the program method shown in FIG. 10.

Next, a program start voltage for a second page is set based on the calculated program pulse application number A at step 1230.

In the present disclosure, the program start voltage for the second page is set based on the calculated program pulse application number A. In a nonvolatile memory device, a program operation is performed on a page basis, and an erase operation is performed on a block basis. Accordingly, pages included in the same block have the same number of program/erase cycles and also have almost the same program speed characteristic according to the number of program/erase cycles. Thus, the program start voltage for the first page is applied to the second page (i.e., a neighboring page included in the same block).

Meanwhile, the number of program pulses applied until the 1-bit pass occurs indicates the program speed characteristic of a corresponding page. If the number of program pulses applied until the 1-bit pass occurs is small, it means that the program speed is relatively fast. If the number of program pulses applied until the 1-bit pass occurs is great, it means that the program speed is relatively slow.

If, as in the present disclosure, a program operation is performed with a program start voltage being set low with consideration taken of the number of program/erase cycles, during the program operation for the first page, the number of program pulses applied until the 1-bit pass occurs increases. Next, during the program operation for the second page, the increased program start voltage for the second page is applied with this characteristic taken into consideration.

A critical value N is preferably set to 2 (causing two repetitions).

If the number of applied program pulses is greater than the critical value, the program start voltage (Vstart_2) for the second page is set by multiplying a difference between the program pulse application number A and the critical value N by the step voltage (Vstep) and adding the multiplication result and the program start voltage value (Vstart_1) for the first page. That is, the program start voltage (Vstart_2) for the second page is calculated using the following Equation.

$$Vstart\_2 = Vstart\_1 + (A-N)*Vstep \quad (1)$$

When the number of applied program pulses is less than or equal to the critical value N, the program start voltage (Vstart_1) for the first page is set as the program start voltage (Vstart_2) for the second page. That is, the second program start voltage is calculated using the following Equation.

$$Vstart\_2 = Vstart\_1 \quad (2)$$

FIG. 13 is described as an example. In the program operation for the first page, the number of program pulses applied until the 1-bit pass occurs is 5, which is 3 greater than the critical value 2. Accordingly, the program start voltage for the second page is set by adding three times the step voltage to the program start voltage for the first page.

The program operation for the second page is then performed based on the set program start voltage at step 1240.

As described above, the program start voltage for the second page is variably set according to a program result of the first page. Accordingly, the time that it takes to apply dummy program pulses can be reduced. That is, when the program operation for the second page is performed as in FIG. 13, the time that it takes to apply a dummy program pulse three times and to perform a verification operation three times can be reduced.

Figure 14:
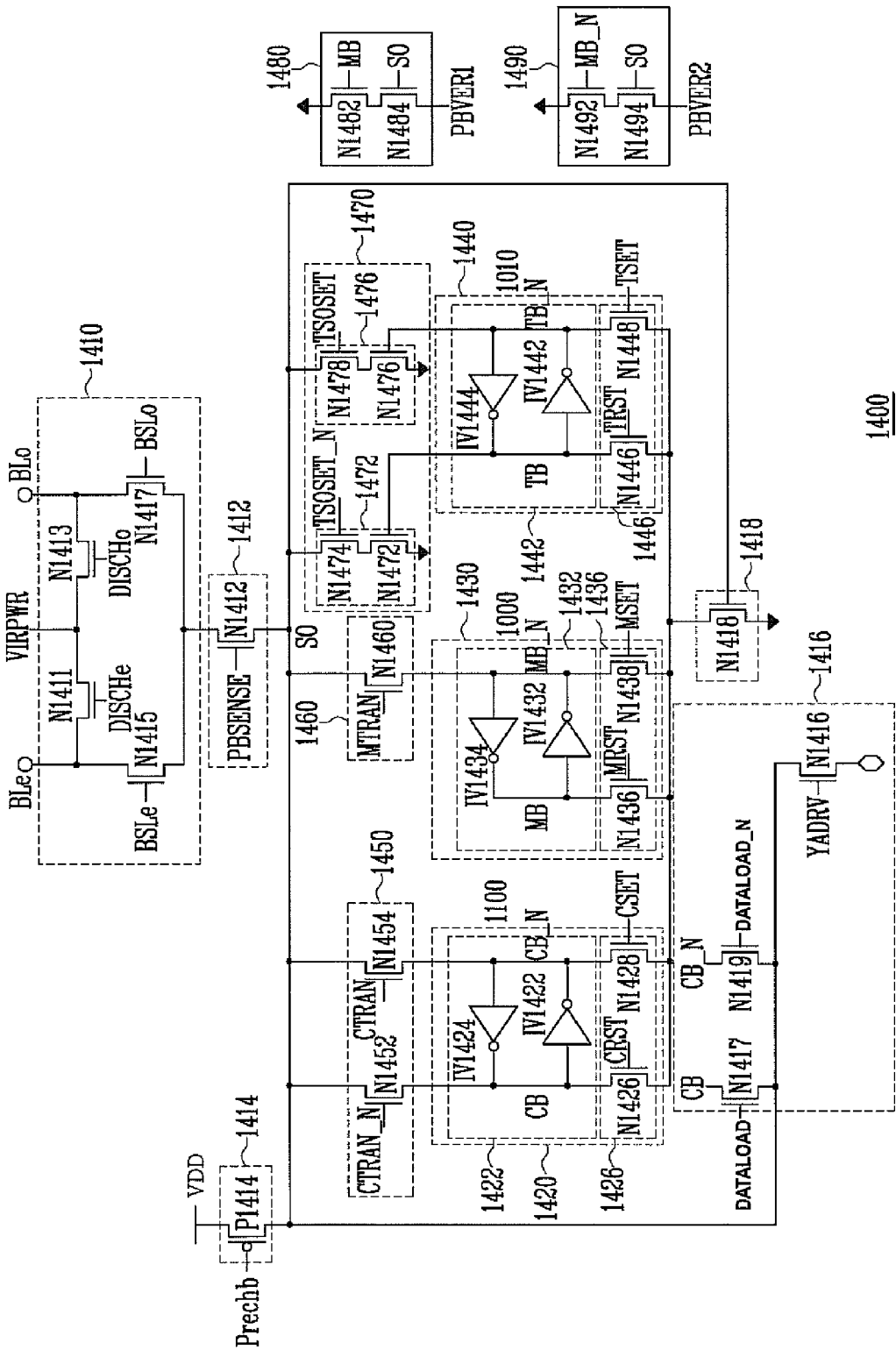
FIG. 14 is a diagram showing the page buffer of a nonvolatile memory device according to an embodiment.

FIG. 14 is a diagram showing the page buffer of a nonvolatile memory device according to an embodiment.

It is evident that the illustrated page buffer is only illustrative and may be variously modified by an implementer.

The page buffer 1400 includes a bit line selection unit 1410, a bit line sense unit 1412, a sense node precharge unit 1414, a data input unit 1416, a ground voltage supply unit 1418, a first register 1420, a second register 1430, a third register 1440, a first data transmission unit 1450, a second data transmission unit 1460, a sense node discharge unit 1470, a pass completion determination unit 1480, and a 1-bit pass determination unit 1490.

The bit line selection unit 1410 includes an NMOS transistor N1415 configured to couple an even bit line BLe and a sense node SO in response to a first bit line selection signal BSLe and an NMOS transistor N1417 configured to couple an odd bit line BLo and the sense node SO in response to a second bit line selection signal BSLo. The bit line selection unit 1410 further includes a variable voltage input terminal configured to apply a variable voltage VIRPWR of a specific level, an NMOS transistor N1411 configured to couple the even bit line BLe and the variable voltage input terminal in response to a first discharge signal DISCHe, and an NMOS transistor N1413 configured to couple the odd bit line BLo and the variable voltage input terminal in response to a second discharge signal DISCHo. A specific bit line and the sense node SO can be selectively coupled to each other according to the above construction. The bit line sense unit 1412 includes an NMOS transistor N1412 which is turned on in response to a bit line sense signal PBSENSE and is coupled to the bit line selection unit 1410 and the sense node SO. During verification/read operations, the bit line sense unit 1412 applies a sense voltage so that the state of a specific memory cell can be transferred to the sense node SO. Meanwhile, according to some embodiments, the bit line sense unit 1412 may be omitted, and the bit line select transistors N1415 and N1417 of the bit line selection unit 1410 may play the role of the omitted bit line sense unit 1412.

The sense node precharge unit 1414 applies a logic high-level voltage VDD to the sense node SO in response to a precharge signal Prechb. To this end, the sense node precharge unit 1414 includes a PMOS transistor P1414 coupled between a power supply voltage terminal VDD and the sense node SO. Accordingly, the power supply voltage of a logic high level is applied to the sense node SO in response to the precharge signal Prechb of a logic low level.

The data input unit 1416 receives external data and transfers it to the first register 1420. To this end, the data input unit 1416 includes an NMOS transistor N1416 configured to transfer external data in response to an input driving signal YADRV, an NMOS transistor N1417 configured to transfer the external data to the first node CB of the first register 1420 in response to a first data input signal DATALOAD, and an NMOS transistor N1419 configured to transfer the external data to the second node CB_N of the first register 1420 in response to a second data input signal DATALOAD_N.

The ground voltage supply unit 1418 applies a ground voltage to each of the registers 1420, 1430, and 1440 according to a voltage level of the sense node SO. To this end, the ground voltage supply unit 1418 includes an NMOS transistor N1418 configured to have a gate coupled to the sense node SO and coupled between the ground terminal and each of the registers 1420, 1430, and 1440. Accordingly, the ground voltage is applied to each of the registers according to a voltage level of the sense node SO.

The first register 1420 includes a latch unit 1422 configured to store data and a data setting unit 1426 configured to transfer the ground voltage, received from the ground voltage supply unit 1418, to the latch unit 1422 in response to a data setting signal CRST or CSET. The latch unit 1422 includes a first inverter IV1422 and a second inverter IV1424. The input terminal of the first inverter IV1422 is coupled to the output terminal of the second inverter IV1424, and the output terminal of the first inverter IV1422 is coupled to the input terminal of the second inverter IV1424. A node between the input terminal of the first inverter IV1422 and the output terminal of the second inverter IV1424 is called the first node CB, and a node between the output terminal of the first inverter IV1422 and the input terminal of the second inverter IV1424 is called the second node CB_N.

Accordingly, data with opposite levels are stored in the first node CB and the second node CB_N.

The data setting unit 1426 includes an NMOS transistor N1426 configured to apply the ground voltage, received from the ground voltage supply unit 1418, to the first node CB in response to the first data setting signal CRST and an NMOS transistor N1428 configured to apply the ground voltage, received from the ground voltage supply unit 1418, to the second node CB_N in response to the second data setting signal CSET.

The second register 1430 includes a latch unit 1432 configured to store data and a data setting unit 1436 configured to transfer the ground voltage, received from the ground voltage supply unit 1418, to the latch unit 1432 in response to a data setting signal MRST or MSET. The latch unit 1432 includes a first inverter IV1432 and a second inverter IV1434. The input terminal of the first inverter IV1432 is coupled to the output terminal of the second inverter IV1434, and the output terminal of the first inverter IV1432 is coupled to the input terminal of the second inverter IV1434. A node between the input terminal of the first inverter IV1432 and the output terminal of the second inverter IV1434 is called a first node MB, and a node between the output terminal of the first inverter IV1432 and the input terminal of the second inverter IV1434 is called a second node MB_N. Accordingly, data with opposite levels are stored in the first node MB and the second node MB_N.

The data setting unit 1436 includes an NMOS transistor N1436 configured to transfer the ground voltage, received from the ground voltage supply unit 1418, to the first node MB in response to a first data setting signal MRST and an NMOS transistor N1438 configured to transfer the ground voltage, received from the ground voltage supply unit 1418, to the second node MB_N in response to a second data setting signal MSET.

The third register 1440 includes a latch unit 1442 configured to store data and a data setting unit 1446 configured to transfer the ground voltage, received from the ground voltage supply unit 1418, to the latch unit 1442 in response to a data setting signal TRST or TSET.

The latch unit 1442 includes a first inverter IV1442 and a second inverter IV1444. The input terminal of the first inverter IV1442 is coupled to the output terminal of the second inverter IV1444, and the output terminal of the first inverter IV1442 is coupled to the input terminal of the second inverter IV1444. A node between the input terminal of the first inverter IV1442 and the output terminal of the second inverter IV1444 is called a first node TB, and a node between the output terminal of the first inverter IV1442 and the input terminal of the second inverter IV1444 is called a second node TB_N. Accordingly, data with opposite levels are stored in the first node TB and the second node TB_N.

The data setting unit 1446 includes an NMOS transistor N1446 configured to transfer the ground voltage, received from the ground voltage supply unit 1418, to the first node TB in response to the first data setting signal TRST and an NMOS transistor N1448 configured to transfer the ground voltage, received from the ground voltage supply unit 1418, to the second node TB_N in response to the second data setting signal TSET.

The first data transmission unit 1450 includes an NMOS transistor N1452 configured to transfer data, stored in the first node CB of the first register 1420, to the sense node SO in response to a first data transmission signal CTRAN_N and an NMOS transistor N1454 configured to transfer data, stored in the second node CB_N of the first register 1420, to the sense node SO in response to a second data transmission signal CTRAN. Accordingly, data stored in a specific node of the first register 1420 can be transferred to the sense node SO in response to a specific data transmission signal.

The second data transmission unit 1460 includes an NMOS transistor N1460 configured to transfer data, stored in the second node MB_N of the second register 1430, to the sense node SO in response to a data transmission signal MTRAN.

The sense node discharge unit 1470 includes a first discharge unit 1472 and a second discharge unit 1476. The first discharge unit 1472 discharges the sense node SO to the ground according to a level of a first sense node discharge signal TSOSET_N or a level of the first node TB of the third register 1440. The second discharge unit 1476 discharges the sense node SO to the ground according to a level of a second sense node discharge signal TSOSET or a level of the second node TB_N of the third register 1440.

The first discharge unit 1472 includes first and second NMOS transistors N1472 and N1474 coupled in series between the sense node SO and the ground. As shown in FIG. 14, the first NMOS transistor N1472 coupled to the ground is turned on according to a level of the first node TB, and the second NMOS transistor N1474 coupled to the sense node SO is turned on according to a level of the first sense node discharge signal TSOSET_N. According to some embodiments, the first NMOS transistor N1472 coupled to the ground may be turned on according to a level of the first sense node discharge signal TSOSET_N, and the second NMOS transistor N1474 coupled to the sense node SO may be turned on according to a level of the first node TB. Accordingly, only when the first sense node discharge signal TSOSET_N is applied and data stored in the first node TB is in a logic high level, is the sense node SO discharged to the ground.

The second discharge unit 1476 includes third and fourth NMOS transistors N1476 and N1478 coupled in series between the sense node SO and the ground. As shown in FIG. 14, the third NMOS transistor N1476 coupled to the ground is turned on according to a level of the second node TB_N, and the fourth NMOS transistor N1478 coupled to the sense node SO is turned on according to a level of the second sense node discharge signal TSOSET. According to some embodiments, the third NMOS transistor N1476 coupled to the ground may be turned on according to a level of the second sense node discharge signal TSOSET, and the fourth NMOS transistor N1478 coupled to the sense node SO may be turned on according to a level of the second node TB_N. Accordingly, only when the second sense node discharge signal TSOSET is applied and data stored in the second node TB_N is in a logic high level, is the sense node SO discharged to the ground.

The pass completion determination unit 1480 includes first and second NMOS transistors N1482 and N1484 coupled in series between the ground terminal and a first verification signal output terminal PBVER1. The first NMOS transistor N1482 is turned on in response to the first node MB of the second register 1430, and the second NMOS transistor N1484 is turned on according to a level of the sense node SO. Accordingly, if voltage of a logic high level is applied to the sense node SO and data of a logic high level is applied to the first node MB of the second register 1430, the ground voltage is output to the first verification signal output terminal PBVER1. If the ground voltage is applied to the first verification signal output terminal PBVER1, a fail signal, indicating that verification has not been completed, is output. In typical cases, in the case of target program data, data '0' is stored in the second node MB_N. If the target program data is programmed, the data '0' changes to data '1'. That is, if a program operation for all cells is completed, the data '0' is stored in the first node MB. Accordingly, if the program operation for all the cells is completed, the first NMOS transistor N1482 of each of the pass completion determination units 1480 is turned on, and so the first verification signal output terminal PBVER1 becomes a floating state.

The construction of the pass completion determination unit 1480 is disclosed in Korean Patent Application No. 10-2008-0044127 which was also filed by the applicant of the present disclosure in the name of a pass/fail check unit 280, 1290. The pass completion determination unit 1480 is used to check whether each of target verification cells has been programmed to exceed a verification voltage. For a detailed construction of the pass completion determination unit 1480, reference can be made to the description of the above disclosed patent application.

The 1-bit pass determination unit 1490 includes first and second NMOS transistors N1492 and N1494 coupled in series between the ground terminal and a second verification signal output terminal PBVER2. The first NMOS transistor N1492 is turned on according to a level of the second node MB_N of the second register 1430, and the second NMOS transistor N1494 is turned on according to a level of the sense node SO.

In typical cases, in the case of target program data, data '0' is stored in the second node MB_N. If the target program data is programmed, the data '0' changes to data '1'. In other words, according to a known read operation or a known verification operation, in the case where any one cell is programmed to exceed a verification voltage, the voltage level of the sense node SO maintains a logic high level. Thus, the ground voltage supply unit 1418 operates to transfer the ground voltage to the data setting unit 1436. In this case, the data '0' stored in the second node MB_N changes to the data '1' in response to the first data setting signal MRST. Accordingly, if first target verification cells are programmed to exceed the first verification voltage, voltage of a logic high level is applied to the sense node SO, and data of a logic high level is applied to the second node MB_N of the second register 1430. Consequently, the ground voltage is output to the second verification signal output terminal PBVER2.

Meanwhile, in the case of target erase cells, data '1' is stored in the second node MB_N beginning with an initial operation, but the voltage level of the sense node SO will remain in a logic low level during the read operation. Accordingly, the cells prevent the 1-bit pass determination unit 1490 from transferring the ground voltage to the second verification signal output terminal PBVER2.

Accordingly, if the ground voltage is applied to the second verification signal output terminal PBVER2, it is recognized that one or more cells programmed to exceed the first verification voltage exist (i.e., the occurrence of the 1-bit pass).

Figure 15:
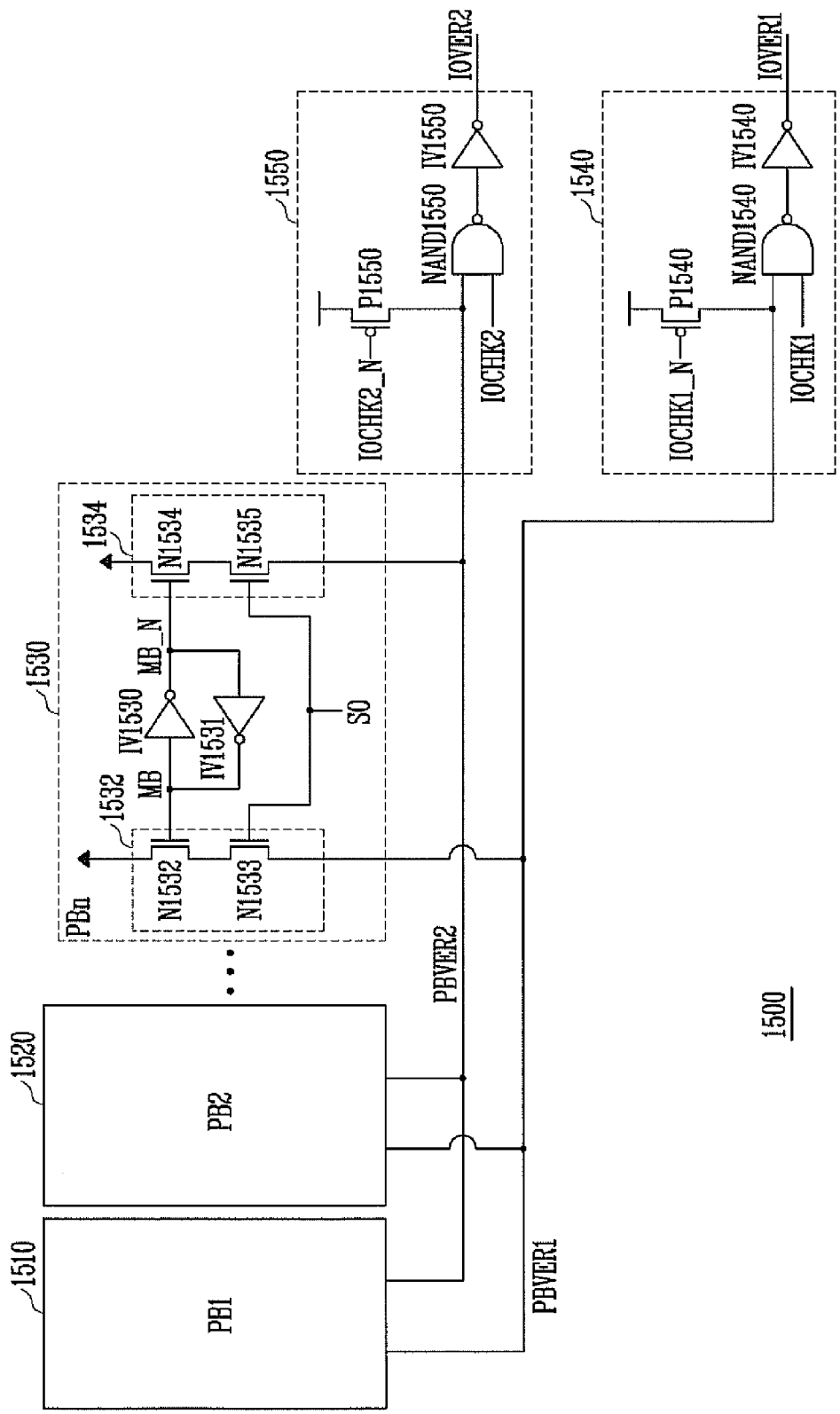
FIG. 15 is a diagram showing a nonvolatile memory device according to an embodiment.

FIG. 15 is a diagram showing the coupling relationship of the 1-bit pass determination unit in the nonvolatile memory device according to an embodiment.

The nonvolatile memory device 1500 includes a plurality of page buffers 1510, 1520, and 1530, . . . , a first logic combination unit 1540 configured to output a signal, indicating whether a pass has been completed according to a state of the first verification signal output terminal PBVER1, and a second logic combination unit 1550 configured to output a signal, indicating whether a pass has been completed according to a state of the second verification signal output terminal PBVER2. In typical cases, one page buffer is coupled to two cells via an even bit line and an odd bit line, and therefore, the number of page buffers corresponds to ½ of the number of cells which are included in a single page.

As described above, each page buffer includes a pass completion determination unit 1532 and a 1-bit pass determination unit 1534. The output terminal of the pass completion determination unit 1532 of each page buffer is coupled in parallel to the first verification signal output terminal PBVER1, and the output terminal of the 1-bit pass determination unit 1534 of each page buffer is coupled in parallel to the second verification signal output terminal PBVER2. The pass completion determination unit 1532 and the 1-bit pass determination unit 1534 have the same constructions as the pass completion determination unit 1480 and the 1-bit pass determination unit 1490 shown in FIG. 14, respectively, and a description thereof is omitted, for simplicity.

The first logic combination unit 1540 inputs a signal of the first verification signal output terminal PBVER1 and outputs a signal, indicating whether a pass has been completed, in response to a first check signal IOCHK1.

To this end, the first logic combination unit 1540 includes a first pull-up element P1540 configured to precharge the first verification signal output terminal PBVER1 to a logic high level in response to an inverted first check signal IOCHK1_N. The first pull-up element P1540 includes a PMOS transistor P1540. The PMOS transistor P1540 is coupled between the first verification signal output terminal PBVER1 and the power supply voltage terminal and is configured to have a gate to which the inverted first check signal IOCHK1_N is input.

The first logic combination unit 1540 further includes an NAND gate NAND1540 and an inverter IV1540. The NAND gate NAND1540 receives the first check signal IOCHK1 and a signal of the first verification signal output terminal PBVER1. The inverter IV1540 inverts the output of the NAND gate NAND1540 and outputs the inverted result.

The operation of the first logic combination unit 1540 is described below. First, when the first check signal IOCHK1 of a logic high level is applied, the first pull-up element P1540 precharges the first verification signal output terminal PBVER1 to a logic high level. Furthermore, a signal of a logic high level is input to the NAND gate NAND1540. As described above, if target program cells are programmed to exceed a verification voltage, the output terminal of the pass completion determination unit 1532 of a corresponding page buffer becomes a floating state. However, if a cell programmed not to exceed the verification voltage exists, the NMOS transistors N1532 and N1533 are turned on, and so the first verification signal output terminal PBVER1 is grounded. If the first verification signal output terminal PBVER1 is in the floating state, the precharge level made by the first pull-up element P1540 remains intact. Accordingly, a pass completion signal IOVER1, indicating that all target program cells have been programmed to exceed the verification voltage, is output. In other words, when the pass completion signal IOVER1 of a logic high level is output, it means that all target program cells have been programmed to exceed the verification voltage. When the pass completion signal IOVER1 of a logic low level is output, it means that not all target cells have been programmed to exceed the verification voltage. A detailed construction of the logic combination unit 1540 may be variously modified by an implementer.

The second logic combination unit 1550 inputs a signal of the second verification signal output terminal PBVER2 and outputs a signal indicating that a 1-bit pass has occurred, in response to a second check signal IOCHK2.

To this end, the second logic combination unit 1550 includes a second pull-up element P1550 configured to precharge the second verification signal output terminal PBVER2 to a logic high level in response to an inverted second check signal IOCHK2_N. The second pull-up element P1550 includes a PMOS transistor P1550. The PMOS transistor P1550 is coupled between the second verification signal output terminal PBVER2 and the power supply voltage terminal and is configured to have a gate to which the inverted second check signal IOCHK2_N is input.

The second logic combination unit 1550 further includes an NAND gate NAND1550 and an inverter IV1550. The NAND gate NAND1550 receives the second check signal IOCHK2 and a signal of the second verification signal output terminal PBVER2. The inverter IV1550 inverts the output of the NAND gate NAND1550 and outputs the inverted result.

The operation of the second logic combination unit 1550 is described below. First, when the second check signal IOCHK2 of a logic high level is applied, the second pull-up element P1550 precharges the second verification signal output terminal PBVER2 to a logic high level. Furthermore, a signal of a logic high level is input to the NAND gate NAND1550.

For a program operation, data '0' or '1' is stored in the second node MB_N. The data '0' corresponds to target program cells, and the data '1' corresponds to target erase cells. Accordingly, target program cells enable the NMOS transistors N1534 to be turned off, and so the output terminal of each of the 1-bit pass determination units 1534 becomes a floating state. Furthermore, since the sense node of the target erase cells will remain in a logic low level, the NMOS transistors N1535 are turned off, and so the output terminal of each of the 1-bit pass determination units 1534 becomes a floating state.

That is, the second verification signal output terminal PBVER2 maintains the floating state until a cell is programmed to exceed a verification voltage according to the program operation.

Next, when a cell programmed to exceed the first verification voltage exists as described above, the output terminal of the 1-bit pass determination unit 1534 of a corresponding page buffer becomes a ground state. That is, since the NMOS transistors N1534 and N1535 are turned on, the second verification signal output terminal PBVER2 is grounded.

Accordingly, the precharge level made by the second pull-up element P1550 is grounded by the second verification signal output terminal PBVER2, and so a signal of a logic low level is input to one terminal of the NAND gate NAND1550. Consequently, a 1-bit pass signal IOVER2, indicating that a cell programmed to exceed the verification voltage exists, is output. In other words, when the 1-bit pass signal IOVER2 of a logic low level is output, it means that one or more cells programmed to exceed the verification voltage exist. When the 1-bit pass signal IOVER2 of a logic high level is output, it means that a cell programmed to exceed the verification voltage does not exist. A detailed construction of the logic combination unit 1550 may be variously modified by an implementer.

Figure 16:
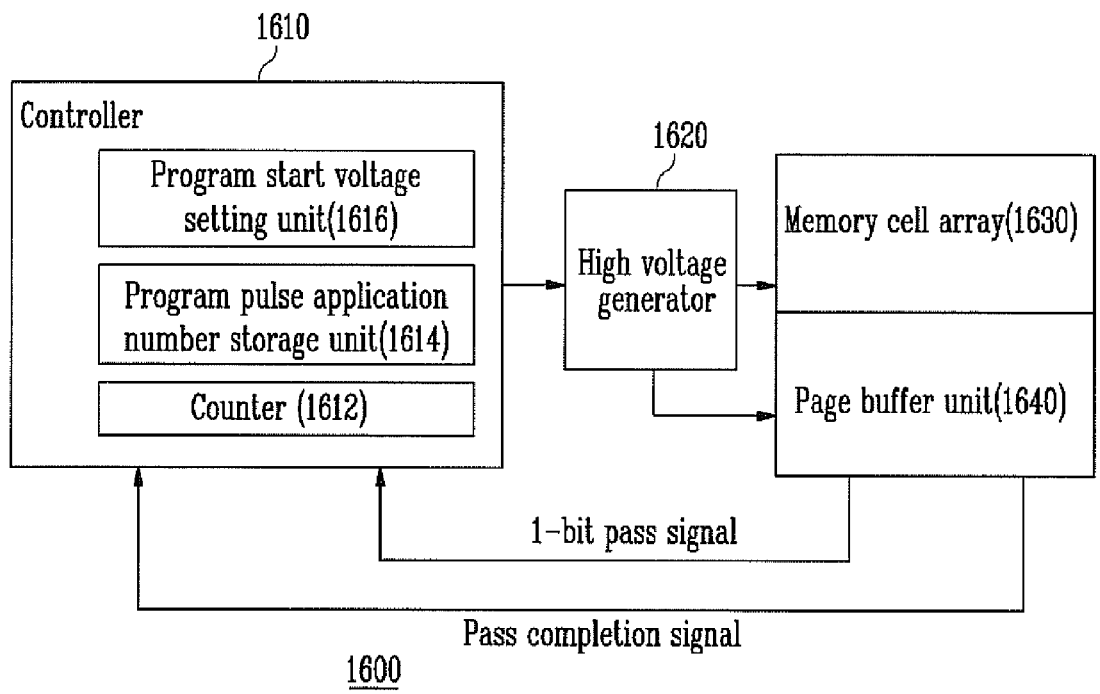
FIG. 16 is a diagram showing a nonvolatile memory device according to another embodiment.

FIG. 16 is a diagram showing a nonvolatile memory device according to another embodiment.

The nonvolatile memory device 1600 includes a controller 1610, a high voltage generator 1620, a memory cell array 1630, and a page buffer unit 1640.

The controller 1610 performs various operations of the nonvolatile memory device, such as a program operation, a read operation, and an erase operation. The controller 1610 performs operations corresponding to external commands, addresses, and data. Furthermore, the controller 1610 controls the high voltage generator 1620 so that the high voltage generator 1620 applies a high voltage (a program voltage, a pass voltage, or a read voltage), corresponding to each operation, to the memory cell array. Further, in the verification operation performed during the program operation, the controller 1610 determines whether each memory cell has been programmed to exceed a reference voltage. When the pass completion signal is received, the controller 1610 controls the program operation so that the program operation is finished.

In the present disclosure, the number of program pulses applied (or a program pulse application number), until all target program cells included in a first page are programmed to exceed a reference voltage (i.e., until a 1-bit pass occurs), is counted, and a program start voltage for a second page is set based on the counted program pulse application number. To this end, the controller 1610 includes a program start voltage setting unit 1616, a program pulse application number storage unit 1614, and a counter 1612.

The counter 1612 increases a program pulse application number by '1' whenever a program pulse is applied and counts the increased program pulse application number. The counter 1612 stores the counted program pulse application number in the program pulse application number storage unit 1614 in response to the 1-bit pass signal IOVER2 received from the second logic combination unit 1550 of FIG. 15. The stored program pulse application number becomes the program pulse application number for the first page. Meanwhile, the program operation for the first page continues until the pass completion signal IOVER1 is output from the first logic combination unit 1560.

The program pulse application number storage unit 1614 stores the number of program pulses applied until the 1-bit pass for the first page occurs.

The program start voltage setting unit 1616 sets a program start voltage for a second page based on the number of program pulses applied until the 1-bit pass occurs during the program operation for the first page. For a detailed method of setting the program start voltage, reference can be made to FIG. 12.

The high voltage generator 1620 generates high voltages for various operations of the nonvolatile memory device and supplies the generated voltages to the memory cell array 1630, the page buffer unit 1640, and so on under the control of the controller 1610. In particular, the high voltage generator 1620 generates a program voltage according to a program start voltage, set by the program start voltage setting unit 1616, and transfers the generated program voltage to the memory cell array 1630.

The page buffer unit 1640, as described above with reference to FIG. 15, outputs the 1-bit pass signal when a cell programmed to exceed a reference voltage, from among cells included in a single page, exists. The page buffer unit 1640 also outputs the 1-bit completion signal when all cells included in a single page are programmed to exceed a reference voltage.

In accordance with such a construction, when a program operation for a second page is performed, an optimal program start voltage can be set based on a program result of a first page.

As described above, according to the program method using the dummy program pulse application method and the program method using the blind verification method, there is an advantage in that the time taken for verification operations to be executed can be reduced. That is, when a program operation for a second page is performed, an optimal program start voltage can be set according to a program result of a first page. Furthermore, the program method of the present disclosure can be more efficiently used according to nonvolatile memory devices with a newly improved structure.

What is claimed is:

1. A nonvolatile memory device, comprising:
    a page buffer unit configured to output a 1-bit pass signal when a cell programmed to exceed a reference voltage, from among target program cells included in a single page, exists;
    a counter configured to count a number of program pulses applied to determine a program pulse application number;
    a program pulse application number storage unit configured to store the number of program pulses applied until the 1-bit pass signal is received during a program operation for a first page; and
    a program start voltage setting unit configured to set a program start voltage for a second page based on the stored program pulse application number.

2. The nonvolatile memory device of claim 1, wherein the counter transfers the program pulse application number counted until the 1-bit pass signal is output.

3. The nonvolatile memory device of claim 1, wherein the program start voltage setting unit is configured to:
    set the program start voltage for the second page by multiplying a difference between the program pulse application number and a critical value by a step voltage and adding the multiplication result to a program start voltage value for the first page, when the program pulse application number is greater than a critical value, and
    set the program start voltage value for the second page as the program start voltage for the first page, when the program pulse application number is smaller than or equal to the critical value.

4. A method of operating a nonvolatile memory device using a dummy program pulse application method for compensating for an increased program speed characteristic according to an increase in a number of program/erase cycles, the method comprising:
performing a program operation on a first page;
counting a program pulse application number and repeatedly performing the program operation and a verification operation until a cell programmed to exceed a verification voltage is detected;
performing program and verification operations using a blind verification method to thereby complete the program operation for the first page when a cell programmed to exceed the verification voltage is detected;
setting a program start voltage for a second page based on a program pulse application number counted until a cell programmed to exceed the verification voltage is detected; and
performing a program operation for the second page based on the set program start voltage.

5. The method of claim 4, wherein the performing of program and verification operations according to a blind verification method to thereby complete the program operation for the first page when a cell programmed to exceed the verification voltage is detected comprises:
repeatedly performing a program operation and a first verification operation up to a first critical value;
repeatedly performing the program operation, the first verification operation, and a second verification operation up to a second critical value when the number of program operations and first verification operations executed exceeds the first critical value; and
repeatedly performing the program operation, the first verification operation, the second verification operation, and a third verification operation when the number of program operations, first verification operations, and second verification operations executed exceeds the second critical value.

6. The method of claim 4, wherein the performing of program and verification operations according to a blind verification method to thereby complete the program operation for the first page when a cell programmed to exceed the verification voltage is detected comprises:
repeatedly performing a program operation and a first verification operation up to a first critical value;
repeatedly performing the program operation, the first verification operation, and a second verification operation up to a second critical value when the number of program operations and first verification operations executed exceeds the first critical value; and
repeatedly performing the program operation, the first verification operation, the second verification operation, and a third verification operation when the number of program operations, first verification operations, and second verification operations executed exceeds the second critical value,
wherein the first verification operation is performed only until first target verification cells are all programmed to exceed the first verification voltage, the second verification operation is performed only until second target verification cells are all programmed to exceed the second verification voltage, and the third verification operation is performed only until third target verification cells are all programmed to exceed the third verification voltage.

7. The method of claim 4, wherein the setting of a program start voltage for a second page based on a program pulse application number counted until a cell programmed to exceed the verification voltage is detected comprises, setting the program start voltage for the second page by multiplying a difference between the program pulse application number and a critical value by a step voltage and adding the multiplication result to a program start voltage value for the first page when the program pulse application number is greater than the critical value.

8. The method of claim 4, wherein the setting of a program start voltage for a second page based on a program pulse application number counted until a cell programmed to exceed the verification voltage is detected comprises, setting a program start voltage value for the first page as the program start voltage for the second page when the program pulse application number is less than or equal to a critical value.

9. A method of operating a nonvolatile memory device using a dummy program pulse application method for compensating for an increased program speed characteristic according to an increase in a number of program/erase cycles, the method comprising:
counting a number of program pulses applied until a cell programmed to exceed a verification voltage is detected, while performing program and verification operations on a first page;
setting a program start voltage for a second page to be programmed after the first page based on the number of program pulses which is counted during the program and verification operations performed on the first page until a cell programmed to exceed the verification voltage is detected; and
counting a number of program pulses applied until a cell programmed to exceed a verification voltage is detected while performing program and verification operations for the second page based on the set program start voltage.

10. The method of claim 9, wherein the setting of a program start voltage for a second page which will be programmed after the first page based on a program pulse application number counted in the program and verification operations for the first page until a cell programmed to exceed a verification voltage is detected comprises, setting a program start voltage for the second page by multiplying a difference between the program pulse application number and a critical value by a step voltage and adding the multiplication result to a program start voltage value for the first page when the program pulse application number is greater than the critical value.

* * * * *